US010693071B2

(12) United States Patent
Yang et al.

(10) Patent No.: US 10,693,071 B2
(45) Date of Patent: Jun. 23, 2020

(54) EFFICIENT AND STABLE PEROVSKITE SOLAR CELLS WITH ALL SOLUTION PROCESSED METAL OXIDE TRANSPORTING LAYERS

(71) Applicant: The Regents of the University of California, Oakland, CA (US)

(72) Inventors: Yang Yang, Los Angeles, CA (US); Jingbi You, Los Angeles, CA (US); Lei Meng, Los Angeles, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 15/553,483

(22) PCT Filed: Mar. 7, 2016

(86) PCT No.: PCT/US2016/021212
§ 371 (c)(1),
(2) Date: Aug. 24, 2017

(87) PCT Pub. No.: WO2016/144883
PCT Pub. Date: Sep. 15, 2016

(65) Prior Publication Data
US 2018/0033983 A1  Feb. 1, 2018

Related U.S. Application Data

(60) Provisional application No. 62/129,662, filed on Mar. 6, 2015.

(51) Int. Cl.
*H01L 51/00* (2006.01)
*H01L 51/42* (2006.01)

(52) U.S. Cl.
CPC ........ *H01L 51/0032* (2013.01); *H01L 51/422* (2013.01); *H01L 51/4233* (2013.01);
(Continued)

(58) Field of Classification Search
CPC ............ H01L 51/4233; H01L 51/4266; H01L 51/422; H01L 51/0032
See application file for complete search history.

(56) References Cited

U.S. PATENT DOCUMENTS

2006/0284230 A1  12/2006  Yang et al.
2015/0249170 A1*  9/2015  Snaith ................ H01L 51/422
                                                136/256
(Continued)

FOREIGN PATENT DOCUMENTS

CN  103746078 A  4/2014
CN  104134711 A  11/2014
(Continued)

OTHER PUBLICATIONS

Liu et al. "Perovskite solar cells with a planar heterojunction structure prepared using room-temperature solution processing technique". Nature Photonics, vol. 8. Published online Dec. 22, 2013. (Year: 2013).*
(Continued)

*Primary Examiner* — Lindsey A Bernier
(74) *Attorney, Agent, or Firm* — Venable LLP; Henry J. Daley; Laura G. Remus

(57) ABSTRACT

An opto-electronic device includes a first electrode, a first buffer layer formed on the first electrode, and a perovskite semiconductor active layer formed on the first buffer layer. The opto-electronic device further includes a second buffer layer formed on the perovskite semiconductor active layer, and a second electrode formed on the second buffer layer. The first buffer layer, the second buffer layer, and the perovskite semiconductor active layer each consists essentially of inorganic materials.

15 Claims, 11 Drawing Sheets

(52) U.S. Cl.
CPC ...... *H01L 51/4246* (2013.01); *H01L 51/0037* (2013.01); *H01L 2251/308* (2013.01); *Y02E 10/549* (2013.01)

(56) References Cited

U.S. PATENT DOCUMENTS

2016/0218308 A1* 7/2016 Desilvestro ........... H01L 51/422
2018/0006254 A1* 1/2018 Mohite ............... H01L 51/0003

FOREIGN PATENT DOCUMENTS

WO   WO-2014-020499 A1   2/2014
WO   WO-2014045021 A1 * 3/2014   ........... H01L 51/422
WO   WO-2015031944 A1 * 3/2015   ........... H01L 51/422

OTHER PUBLICATIONS

International Search Report and Written Opinion in International Application No. PCT/US2016/021212, dated Aug. 19, 2016.
Best Research—Cell Efficiencies, Downloaded Feb. 27, 2014. http://www.nrel.gov/ncpv/images/efficiency_chart.jpg.
Burschka et al., "Sequential deposition as a route to high-performance perovskite-sensitized solar cells," Nature 499, 316 (2013).
Chen et al., "Controllable self-induced passivation of hybrid lead iodide perovskites toward high performance solar cells," Nano Lett. 14, 4158 (2014).
Christians et al., "An inorganic hole conductor for organo-lead halide perovskite solar cells. Improved hole conductivity with copper iodide," J. Am. Chem. Soc. 136, 758 (2014).
Conings et al., "Perovskite-based hybrid solar cells exceeding 10% efficiency with high reproducibility using a thin film sandwich approach," Adv. Mater. 26, 2041 (2014).
Docampo et al., "Efficient organometal trihalide perovskite planar-heterojunction solar cells on flexible polymer substrates," Nat. Commun. 4, 2761 (2013).
Garcia et al., "Improvement of interfacial contacts for new small-molecule bulk-heterojunction organic photovoltaics," Adv. Mater. 24, 5368 (2012).
Im et al., "Growth of CH3NH3PbI3 cuboids with controlled size for high-efficiency perovskite solar cells," Nat. Nanotech. 9, 927 (2014).
Jeng et al., "CH3NH3PbI3 perovskite/fullerene planar-heterojunction hybrid solar cells," Adv. Mater. 25, 3727 (2013).
Jeng et al., "Nickel Oxide Electrode Interlayer in CH3NH3PbI3 Perovskite/PCBM Planar-Heterojunction Hybrid Solar Cells," Adv. Mater. 26, 4107 (2014).
Jeon et al., "Solvent engineering for high-performance inorganic-organic hybrid perovskite solar cells," Nat. Mater. 13, 897 (2014).
Kagan et al., "Organic-inorganic hybrid materials as semiconducting channels in thin-film field-effect transistors," Science 286, 945-947 (1999).
Kim et al., "Lead iodide perovskite sensitized all-solid-state submicron thin film mesoscopic solar cell with efficiency exceeding 9%," Sci. Rep. 2, 591 (2012).
Kojima et al., "Organometal halide perovskites as visible-light sensitizers for photovoltaic cells," J. Am. Chem. Soc. 131, 6050 (2009).
Lee et al., "Efficient hybrid solar cells based on meso-superstructured organometal halide perovskites," Science 338, 643 (2012).

Liang et al., "Additive enhanced crystallization of solution-processed perovskite for highly efficient planar-heterojunction solar cells," Adv. Mater. 26, 3748 (2014).
Liu et al., "Efficient planar heterojunction perovskite solar cells by vapour deposition," Nature, 501, 395 (2013).
Liu et al., "Perovskite solar cells with a planar heterojunction structure prepared using room-temperature solution processing techniques," Nat. Photon. 8, 133 (2014).
Manders et al., "Solution-processed nickel oxide hole transport layers in high efficiency polymer photovoltaic cells," Adv. Funct. Mater. 23, 2993 (2013).
Qin et al., "Inorganic hole conductor-based lead halide perovskite solar cells with 12.4% conversion efficiency," Nat. Commun. 5, 3834 (2014).
Rim et al., "Direct light pattern integration of low-temperature solution-processed all-oxide flexible electronics," ACS Nano 8, 9680 (2014).
Stranks et al., "Electron-hole diffusion lengths exceeding 1 micrometer in an organometal trihalide perovskite absorber," Science 342, 341 (2013).
Subbiah et al., "Inorganic hole conducting layers for perovskite-based solar cells," J. Phys. Chem. Lett. 5, 1748 (2014).
Sun et al., "Inverted polymer solar cells integrated with a low-temperature-annealed sol-gel-derived ZnO film as an electron transport layer," Adv. Mater. 23, 1679 (2011).
Wang et al., "Low-temperature sputtered nickel oxide compact thin film as effective electron blocking layer for mesoscopic NiO/CH3NH3PbI3 perovskite heterojunction solar cells," ACS Appl. Mater. Interfaces 6, 11851 (2014).
Wang et al., "P-type mesoscopic nickel oxide/organometallic perovskite heterojunction solar cells," Sci. Rep. 4, 4756 (2014).
Wojciechowski et al., "Heterojunction modification for highly efficient organic-inorganic perovskite solar cells," ACS Nano 8, 12701 (2014).
Xiao et al. "A fast deposition-crystallization procedure for highly efficient lead iodide perovskite thin-film solar cells," Angew. Chem. Int. Ed. 53, 9898 (2014).
Xiao et al., "Efficient, high yield perovskite photovoltaic devices grown by interdiffusion of solution-processed precursor stacking layers," Energy Environ. Sci. 7, 2619 (2014).
Xiao et al., "Solvent annealing of perovskite-induced crystal growth for photovoltaic-device efficiency enhancement," Adv. Mater. 26, 6503 (2014).
Xing et al., "Long-range balanced electron- and hole-transport lengths in organic-inorganic CH3NH3PbI3," Science 342, 344 (2013).
You et al., "Electroluminescence behavior of ZnO/Si heterojunctions: energy band alignment and interfacial microstructure," J. Appl. Phys. 107, 083701 (2010).
You et al., "Low-temperature solution-processed perovskite solar cells with high efficiency and flexibility," ACS Nano 8, 1674 (2014).
You et al., "Metal oxide nanoparticles as electron transport layer in high-performance and stable inverted polymer solar cells," Adv. Mater. 24, 5267 (2012).
You et al., "Moisture assisted perovskite film growth for high performance solar cells," Appl. Phys. Lett. 105, 183902 (2014).
Zhou et al., "Interface engineering of highly efficient perovskite solar cells," Science 345, 542 (2014).
Zhu et al., "High-performance hole-extraction layer of sol-gel-processed NiO nanocrystals for inverted planar perovskite solar cells," Angew. Chem. Int. Ed. 53, 12571 (2014).

* cited by examiner

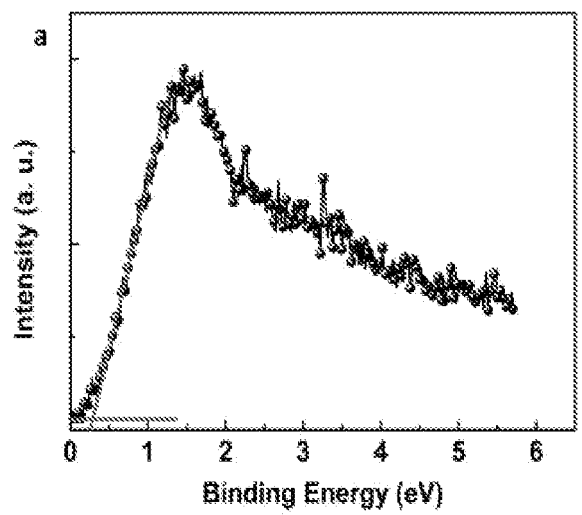
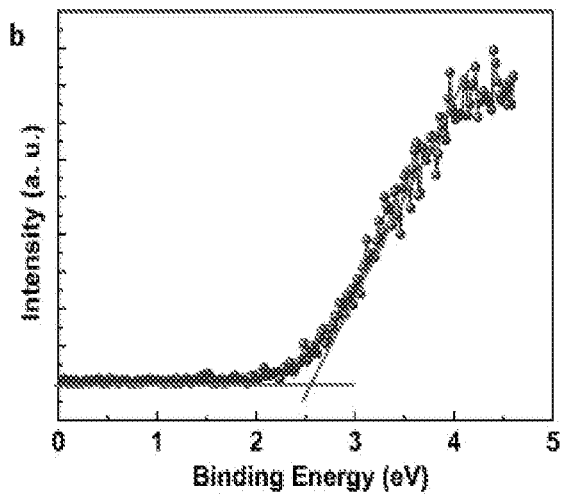
FIG. 6A  FIG. 6B
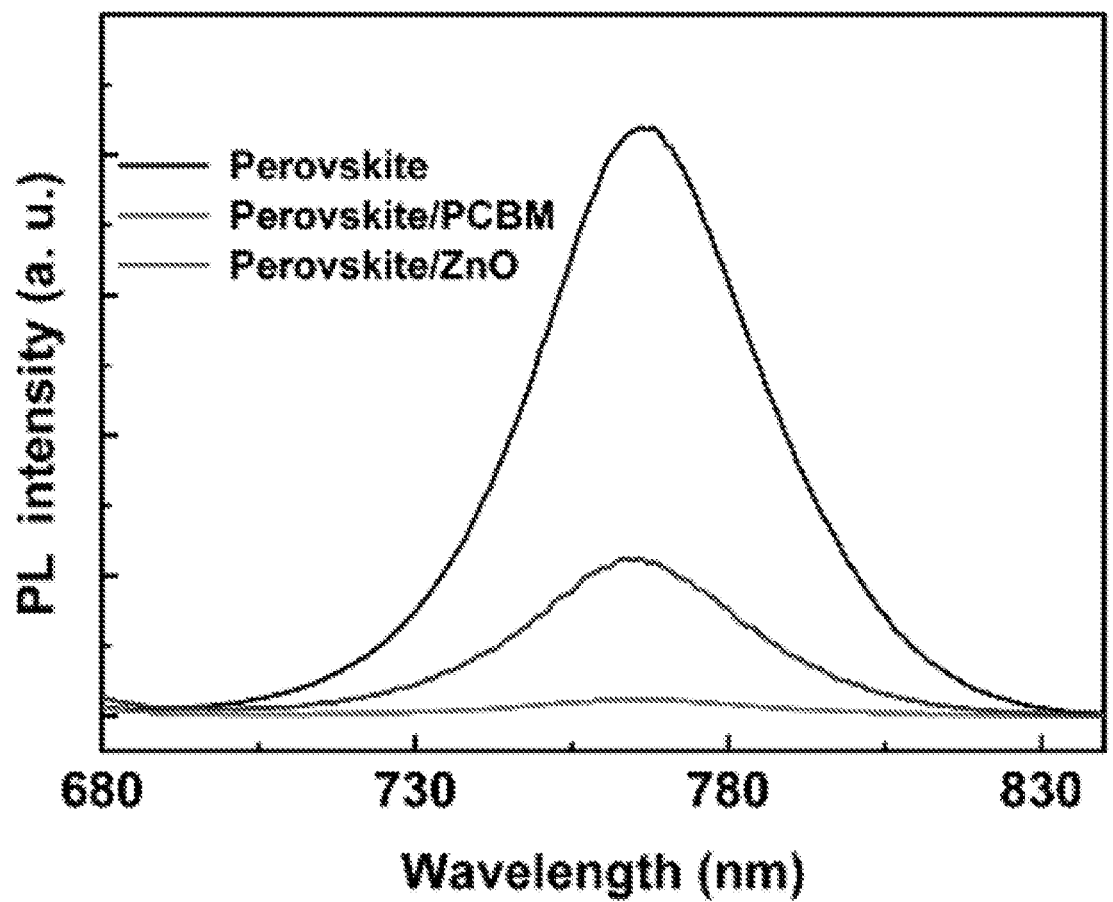
FIG. 7

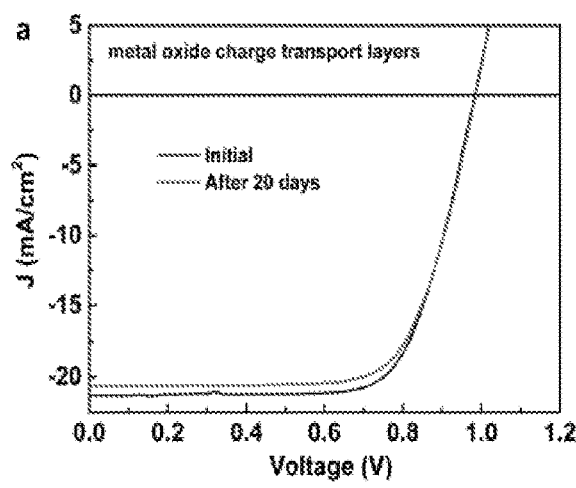 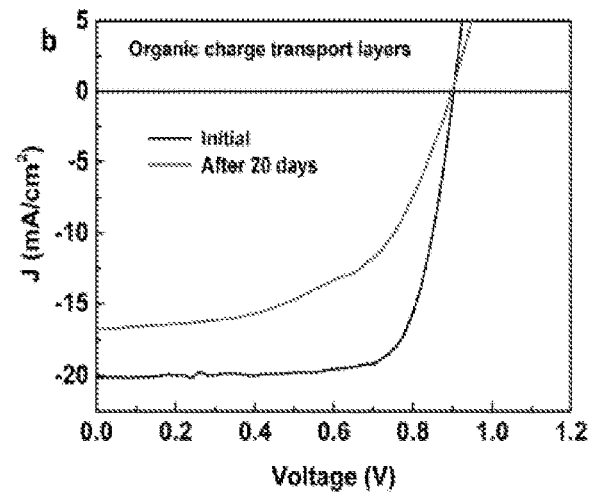
FIG. 17A  FIG. 17B
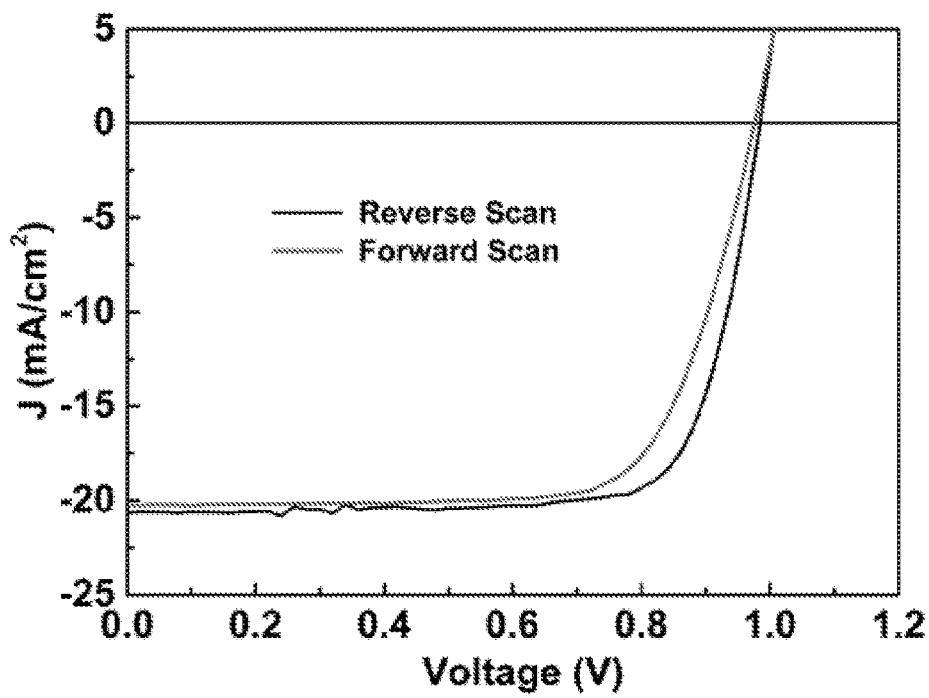
FIG. 18

EFFICIENT AND STABLE PEROVSKITE SOLAR CELLS WITH ALL SOLUTION PROCESSED METAL OXIDE TRANSPORTING LAYERS

This application is a U.S. National Stage Application under 35 U.S.C. § 371 of PCT/US2016/021212, filed on Mar. 7, 2016, the entire content of which is hereby incorporated by reference and this application claims priority to U.S. Provisional Application No. 62/129,662 filed Mar. 6, 2015, the entire content of which is hereby incorporated by reference.

This invention was made with government support under Grant Number ECCS1202231, awarded by the National Science Foundation and under Grant Number FA9550-09-1-0610, awarded by U.S. Air Force, Office of Scientific Research. The government has certain rights in the invention.

BACKGROUND

1. Technical Field

Some embodiments of the present invention relate to solar cells, and more particularly to perovskite solar cells.

2. Discussion of Related Art

Perovskite semiconductors have attracted significant attention 1-2 beginning with their incorporation into photovoltaic devices by Miyasaka et al. in 2009,[2] achieving an initial power conversion efficiency (PCE) about 4%. In the past five years, significant progress has been realized in perovskite solar cells,[3-14] with several groups reporting over 15% PCE by employing mesoporous nanostructures or planar structure.[7-14] Organic transport layers, such as PEDOT:PSS,[13, 14] Spiro-OMeTAD,[8-11] P3HT[15] were used as p-type hole transport layers, and PCBM,[13, 14] PFN,[13] C60, and their derivative[16, 17] were used as n-type electron transport layers. Although incorporating organic charge transport layers can give high efficiency, there are still some disadvantages, such as lower stability and high cost. Consequently, there remains a need for improved perovskite semiconductor devices.

SUMMARY

According to some embodiments of the invention, an opto-electronic device includes a first electrode, a first buffer layer formed on the first electrode, and a perovskite semiconductor active layer formed on the first buffer layer. The opto-electronic device further includes a second buffer layer formed on the perovskite semiconductor active layer, and a second electrode formed on the second buffer layer. The first buffer layer, the second buffer layer, and the perovskite semiconductor active layer each consists essentially of inorganic materials.

According to some embodiments, a method of producing an opto-electronic device includes providing a substrate, forming a first electrode on the substrate, and forming a first buffer layer on the first electrode. The method further comprises forming a perovskite semiconductor active layer on the first buffer layer, forming a second buffer layer on the perovskite semiconductor active layer, and forming a second electrode on the second buffer layer. The first buffer layer, the second buffer layer and the perovskite semiconductor active layer each consists essentially of inorganic materials.

BRIEF DESCRIPTION OF THE DRAWINGS

Further objectives and advantages will become apparent from a consideration of the description, drawings, and examples.

FIG. 6A shows valence band maximum spectra of $NiO_x$ measured by x-ray photoelectron spectroscopy;

FIG. 6B shows valence band maximum spectra of ZnO measured by x-ray photoelectron spectroscopy;

FIG. 7 shows the photoluminescence of glass/$CH_3NH_3PbI_3$, glass/$CH_3NH_3PbI_3$/ZnO, and glass/$CH_3NH_3PbI_3$/PCBM;

FIG. 17A shows a J-V curve of the devices using metal oxide charge transport layers stored in nitrogen box for 20 days;

FIG. 17B shows a J-V curve of the devices using organic charge transport layers stored in nitrogen box for 20 days; and FIG. 18 shows a J-V curve of the devices under reverse (1.2 V→0 V) and forward (0V→1.2 V) scan measurement, wherein the voltage step is 0.02 V, and the delay time is 200 ms.

DETAILED DESCRIPTION

Some embodiments of the current invention are discussed in detail below. In describing embodiments, specific terminology is employed for the sake of clarity. However, the invention is not intended to be limited to the specific terminology so selected. A person skilled in the relevant art will recognize that other equivalent components can be employed and other methods developed without departing from the broad concepts of the current invention. All references cited anywhere in this specification, including the Background and Detailed Description sections, are incorporated by reference as if each had been individually incorporated.

The terms light, optics, etc. are not limited to only visible regions of the electromagnetic spectrum, but are intended to include nonvisible regions such as, but not limited to, infrared, far infrared, and ultraviolet, in addition to visible regions.

The term transparent is intended to mean that a sufficient amount of light passes through to function for the intended purpose.

The term "about" when referring to a measurable value such as an amount, a temporal duration, and the like, is meant to encompass variations of ±20% or ±10%, more preferably ±5%, even more preferably ±1%, and still more preferably ±0.1% from the specified value, as such variations are appropriate to perform the disclosed methods.

Traditionally, organic materials have been used as charge transport layers in efficient perovskite solar cells, thus leading to less stable devices. Recently, several groups have tried to replace these organic transport layers by inorganic materials, e.g. $CuSCN$,[18, 19] $CuI$,[20] $NiO_x$[21-24] as hole transport layer, $ZnO$[25] and $TiO$[28-11] as n-type transport layer. It is known that the metal oxides demonstrate much higher stability than the organic materials. In addition, metal oxides can be easily obtained by solution processing from their corresponding precursors or nanoparticles at low temperature. Lead halide perovskite solar cells have attracted tremendous attention and have shown excellent photovoltaic performance. However, obtaining stable devices is still a great challenge due to the instability of both the perovskite material itself and/or the charge transport layers.

Some embodiments of the current invention provide solution processed metal oxide materials as charge transport layers in perovskite solar cells, i.e. $NiO_x$ as the hole transport layer, ZnO as the electron transport layer, and a p-i-n inverted structure of glass/ITO/NiOx/perovskite/ZnO/Al. We demonstrated all metal oxide based perovskite solar cells with maximum power conversion efficiency of 16.1% and excellent stability, which shows the great promise of efficient and stable perovskite solar cells.

Figure 1:
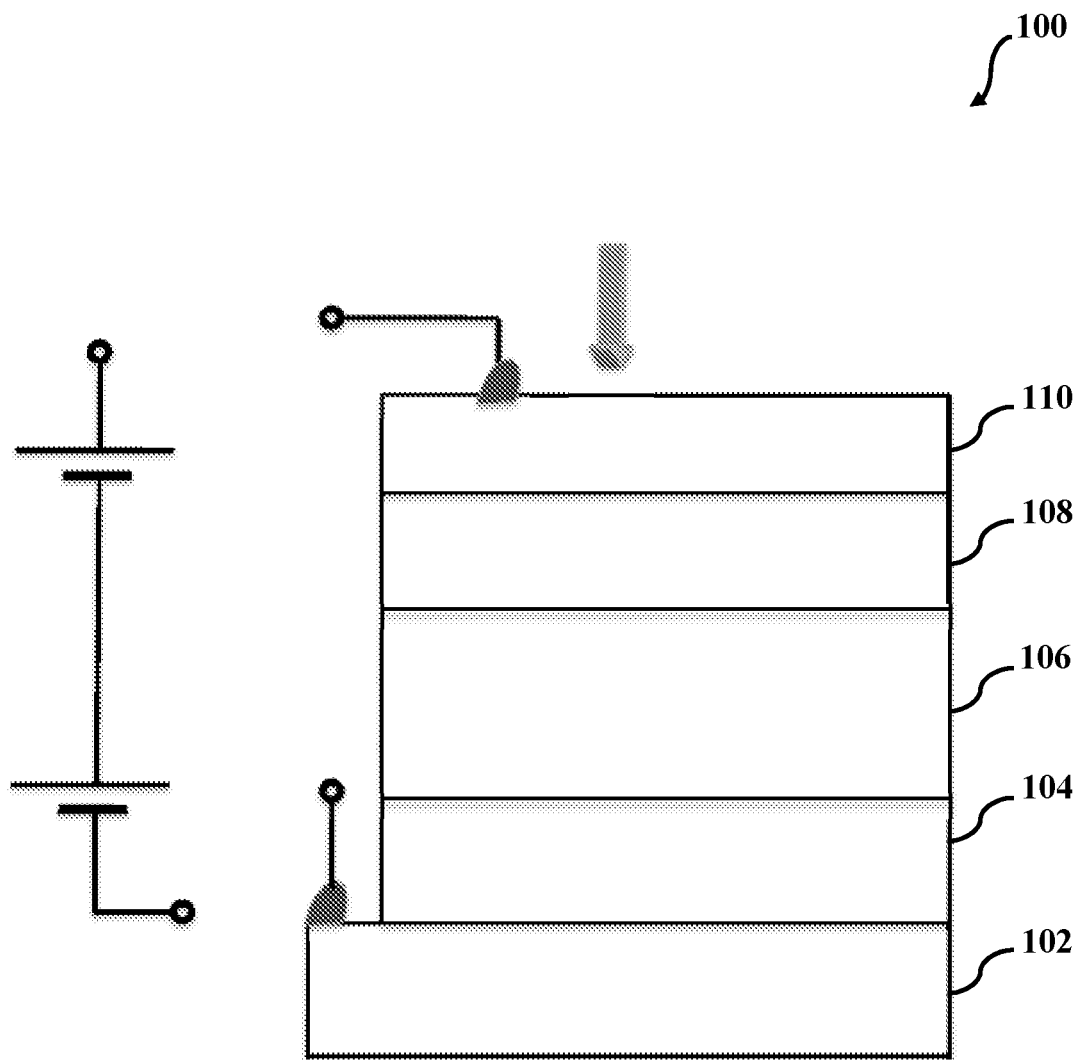
FIG. 1 illustrates an opto-electronic device according to some embodiments of the invention.

An opto-electronic device according to some embodiments of the invention is shown in FIG. 1. The opto-electronic device 100 includes a first electrode 102, a first buffer layer 104 formed on the first electrode 102, and a perovskite semiconductor active layer 106 formed on the first buffer layer. The opto-electronic device 100 further includes a second buffer layer 108 formed on the perovskite semiconductor active layer 106, and a second electrode 110 formed on the second buffer layer 108. The first buffer layer 102, the second buffer layer 108, and the perovskite semiconductor active layer 106 each consists essentially of inorganic materials.

According to some embodiments, the first and second electrodes each consists essentially of inorganic materials. The first and second buffer layers can each consist essentially of at least one metal oxide. According to some embodiments, one of the first and second buffer layers is a p-type buffer layer and the other one of the first and second buffer layers is an n-type buffer layer, wherein the p-type buffer layer comprises at least one of $NiO_x$, $MoO_3$, $V_2O_5$, and $WO_3$, and wherein the n-type buffer layers comprises at least one of $TiO_2$, ZnO, and $Nb_2O_5$. According to some embodiments, the first buffer layer can be $NiO_x$ and the second buffer layer can be ZnO.

According to some embodiments, the first buffer layer can have a thickness between about 75 nm and about 85 nm, and the second buffer layer can have a thickness between about 65 nm and about 75 nm. According to some embodiments, the first buffer layer can include a plurality of nanoparticles, wherein each of the plurality of nanoparticles has a size between about 50 and about 100 nm. The second buffer layer can include a plurality of nanoparticles, wherein each of the plurality of nanoparticles has a size that is less than 10 nm. According to some embodiments, the first buffer layer has a work function between about 5.00 eV and 5.10 eV.

According to some embodiments, the perovskite semiconductor active layer consists essentially of at least one perovskite that satisfies the formula ABX3, wherein A is at least one of CH3NH3 and NH2CHNH2, wherein B is at least one of PB and Sn, and wherein X is at least one of Cl, Br and I. According to some embodiments, the perovskite semiconductor active layer can have a thickness between about 300 nm and about 340 nm. According to some embodiments, the perovskite semiconductor active layer can have a thickness between about 315 nm and about 325 nm.

According to some embodiments, the perovskite semiconductor active layer includes a plurality of crystals, and wherein each of the plurality of crystals has a size greater than 1 µm. According to some embodiments, the plurality of crystals has a size that is greater than a thickness of the perovskite layer. At least one of the first and second electrodes can be a transparent electrode.

According to some embodiments, the opto-electronic device is at least one of a photovoltaic cell, an optical detector, a radiation detector, a light emitting diode (LED), a laser and a memory device. The opto-electronic device can have a normalized power conversion efficiency that remains substantially constant over a period of 20 days.

According to some embodiments, a method of producing an opto-electronic device includes providing a substrate, forming a first electrode on the substrate, forming a first buffer layer on the first electrode, and forming a perovskite semiconductor active layer on the first buffer layer. The method further includes forming a second buffer layer on the perovskite semiconductor active layer, and forming a second electrode on the second buffer layer. The first buffer layer, the second buffer layer and the perovskite semiconductor active layer each consists essentially of inorganic materials.

According to some embodiments, the method further comprises treating the perovskite semiconductor active layer with at least one of an exposure to air for less than one hour, exposure to oxygen, exposure to ultraviolet light, moisture exposure and thermal annealing with a temperature less than 120° C. According to some embodiments, forming a perovskite semiconductor active layer on the first buffer layer comprises forming a layer of $PbI_2$ on the first buffer layer, coating the $PbI_2$ layer with a $CH_3NH_3I$ solution, and annealing the $CH_3NH_3I$ solution coated $PbI_2$ layer to form the perovskite semiconductor active layer.

Some embodiments of the current invention provide perovskite solar cells employing all solution processed metal oxide layers as the charge transport layers. Specifically, we utilize a p-type $NiO_x$ and n-type ZnO nanoparticles films as the hole and electron transport layers, respectively. We have successfully demonstrated perovskite solar cells based on all metal oxide charge transport layers with 16.1% efficiency and excellent stability.

Figures 2A, 2B, 2C, 2D:
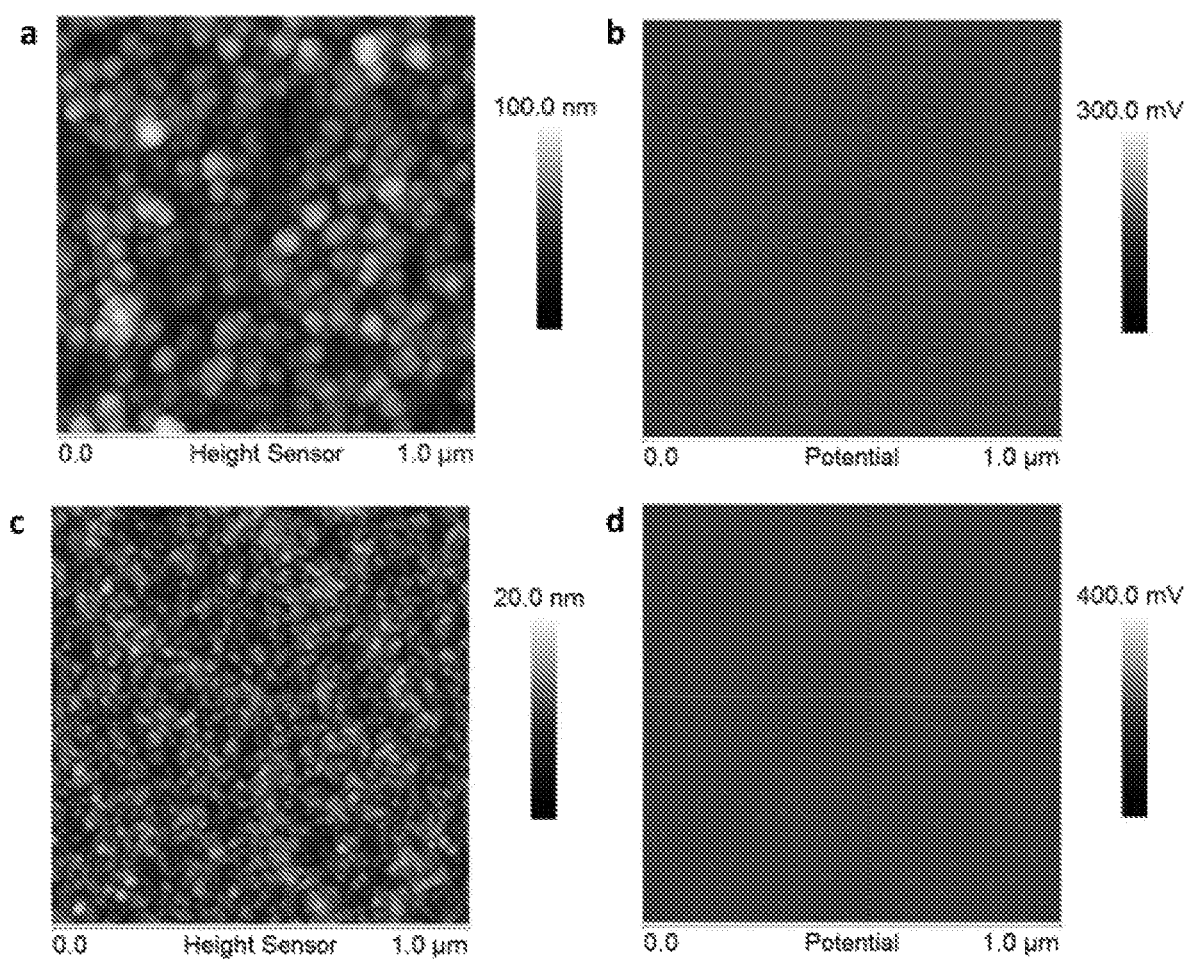
FIG. 2A shows an atomic force microscopy (AFM) image of $NiO_x$ on an ITO substrate.
FIG. 2B shows the surface potential distribution of $NiO_x$ on the ITO substrate.
FIG. 2C shows an atomic force microscopy (AFM) image of ZnO on an ITO substrate.
FIG. 2D shows the surface potential distribution of ZnO on the ITO substrate.
Figure 3:
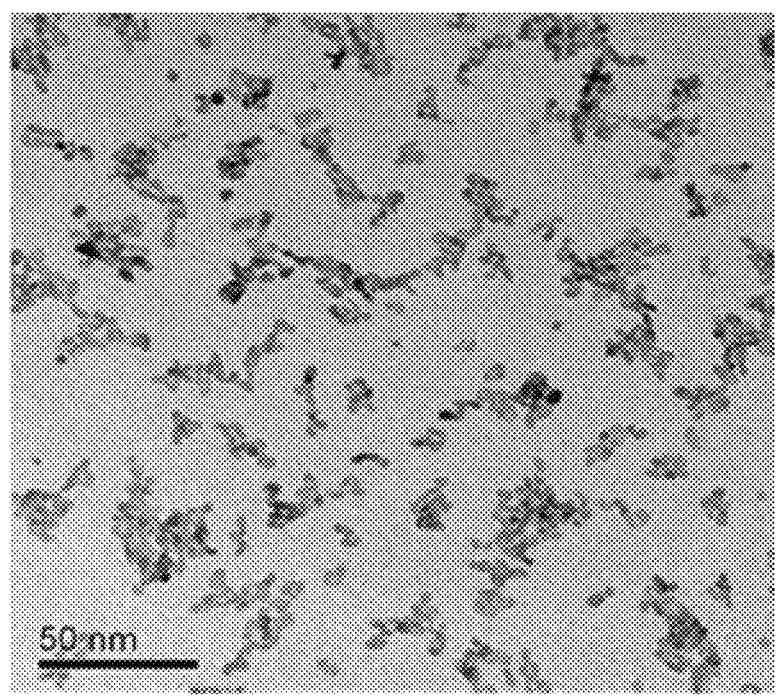
FIG. 3 is a transmission electron microscopy (TEM) image of synthesized ZnO nanoparticles.

FIGS. 2A and 2C show the atomic force microscopy (AFM) images of about 80 nm of $NiO_x$ film and 70 nm of ZnO film on the ITO substrates, respectively. The $NiO_x$ film consisted of uniform nanoparticles, with particle size ranging from 50-100 nm, which can be compared with the corresponding films annealed at higher temperature such as 500° C.[24] The $NiO_x$ film is also dense and can act as a blocking layer. The high quality film obtained is due to the introduction of nickel nitride precursor, which is much different from previous reports utilizing nickel formate dehydrate[21, 26] or nickel acetate tetrahydrate.[27] It has been established that the nitride salt precursor can grow high quality metal oxide films.[28] The AFM image of the ZnO film from spin-coated nanoparticles solution is shown in FIG. 2C. The ZnO nanoparticles film is very smooth and continuous, and the particles size is less than 10 nm. FIG. 3 is a TEM image showing that the synthesized ZnO nanoparticle size is around 5 nm. The average roughness of the ZnO film is less than 2 nm. This will guarantee good coverage of the ZnO on the perovskite film.

Figure 4:
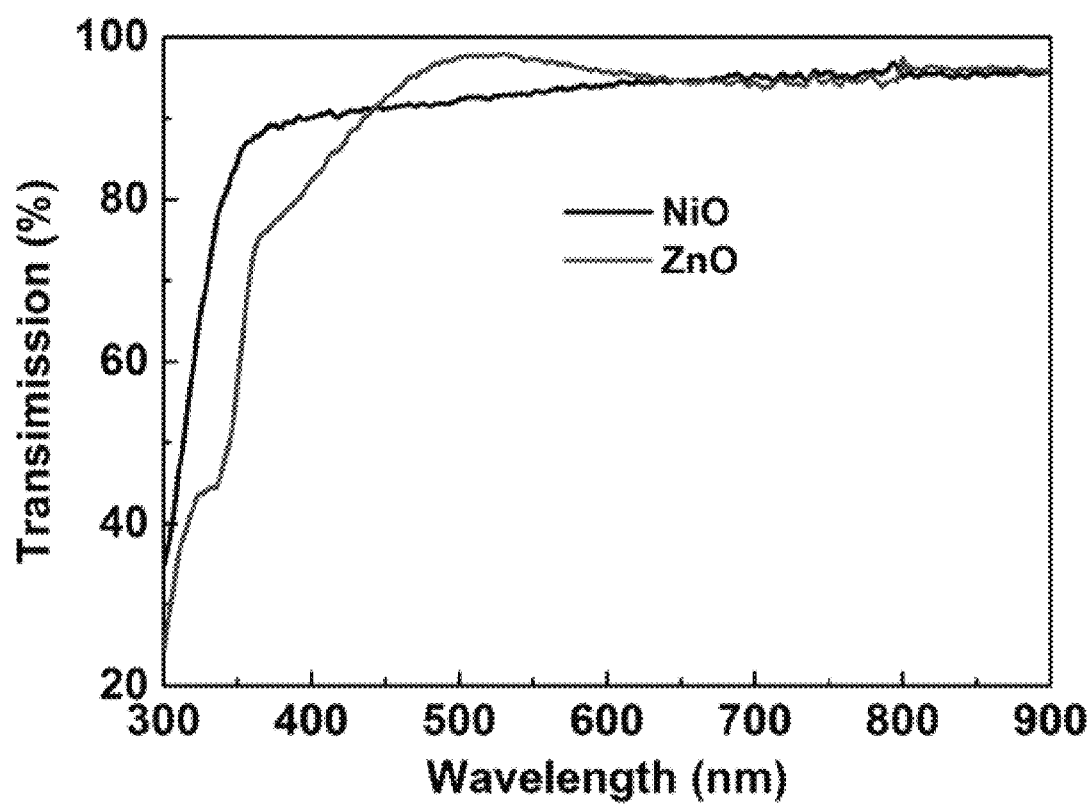
FIG. 4 shows transmission spectra of the $NiO_x$ and ZnO on ITO substrates.

Scanning kelvin probe microscopy (SKPM) was employed to examine electrical properties of the metal oxide films. The SKPM has been used to determine the surface potential difference in the thin film, which helps to reveal the electrical uniformity of the film.[29] The SKPM images of $NiO_x$ and ZnO films are shown in FIGS. 2B and 2D, and the average roughness of the surface potential for both of $NiO_x$ and ZnO are less than 5 mV, indicating that the films have excellent continuous electrical properties. The absorption of the $NiO_x$ and ZnO film are shown in FIG. 4. The $NiO_x$ film showed good transparency from 300-900 nm except for a little bit of absorption in the visible region. This might be from the defect-related absorption.[20-24] The ZnO film also showed good transparency. The transparency of the metal oxide, especially for the $NiO_x$, will guarantee that most of the light shining from the substrate can be transmitted into the perovskite layer and be absorbed.

Figures 5A, 5B, 5C, 5D, 5E, 5F:
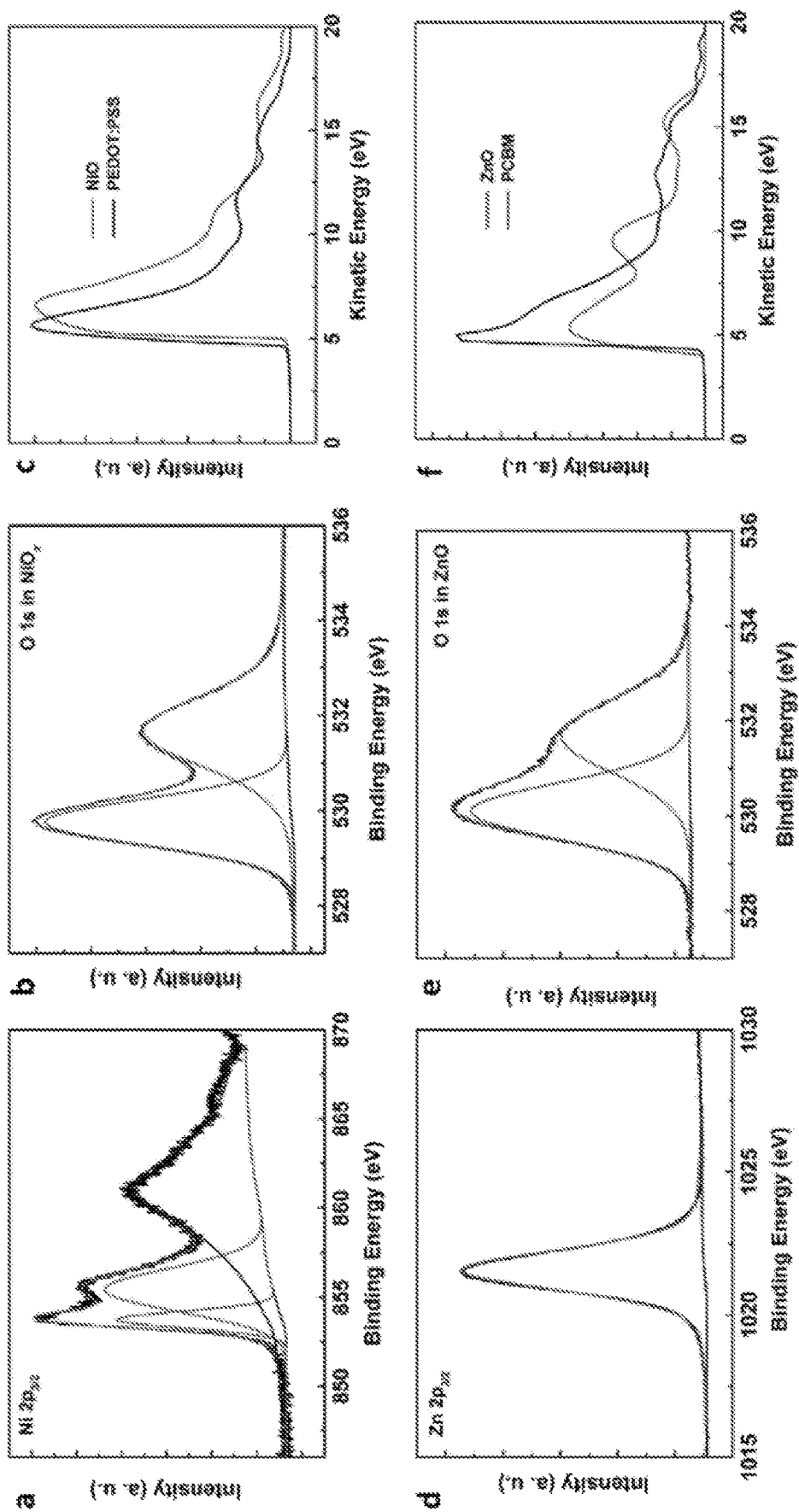
FIG. 5A shows an X-ray photoelectron spectroscopy (XPS) peak of Ni $2p_{3/2}$ in $NiO_x$.
FIG. 5B shows an XPS peak of O 1s in $NiO_x$.
FIG. 5C illustrates ultraviolet photoelectron spectroscopy of $NiO_x$ and PEDOT:PSS.
FIG. 5D shows an XPS peak of Zn $2p_{3/2}$ in ZnO.
FIG. 5E shows an XPS peak of O 1s in ZnO.
FIG. 5F illustrates ultraviolet photoelectron spectroscopy of ZnO and PCBM.

X-ray spectroscopy (XPS) and ultraviolet photoelectron spectroscopy (UPS) measurements were carried out to understand the chemical compositions and band structures of the solution-processed $NiO_x$ and ZnO films. FIG. 5a shows the XPS spectrum of the Ni 2p3/2 in $NiO_x$, which can be separated into three peaks. This is consistent with previous reports by several groups where the $NiO_x$ is obtained via sol-gel processes or sputtering.[24, 27] The peak centered at a binding energy of 853.8 eV has been defined as Ni2+ in the standard Ni—O octahedral bonding configuration in cubic rocksalt $NiO_x$.[27] The peak centered at 855.5 eV was ascribed to the Ni2+ vacancy-induced Ni3+ ion, and the broad peak centered at 861.1 eV was defined as a shakeup process.[27]

FIG. 5B shows the XPS spectrum of the O 1s in $NiO_x$. The peak centered at 529.7 eV confirms the Ni—O octahedral bonding in $NiO_x$.[27] The peak at 531.6 eV might be ascribed to nickel hydroxides, including defective nickel oxide with hydroxyl groups adsorbed on the surface.[27] Generally, the $NiO_x$ obtained by different processing usually shows the non-stoichiometric properties, strictly, it should be $NiO_x$,[24, 27] which is the reason for p-type conductivity of the $NiO_x$ thin film.

The difference between the valence band and Fermi level of $NiO_x$ is about 0.2 eV based on the valence band spectra shown in FIG. 6A, confirming that the $NiO_x$ is a p-type metal oxide. The work function of $NiO_x$ is 5.05 eV determined by ultraviolet photoelectron spectroscopy (UPS) (FIG. 5C), which is higher than that of the conventionally used organic hole transport layer of PEDOT:PSS (4.9 eV, also in FIG. 5C). The work function of $NiO_x$ is closer to the perovskite than that of PEDOT:PSS, inferring that higher open circuit voltage could be obtained for the devices (the device data will be shown later).

The Zn 2p3/2 and O 1s XPS spectra in ZnO are shown in FIGS. 5D and 5E, respectively. The Zn 2p3/2 peak is located at 1021.5 eV. The O 1s XPS spectrum in ZnO also exhibits asymmetric line shapes.[29] The peak with lower binding energy (530.1 eV) corresponds to O atoms in a ZnO crystal. The second peak, at 531.7 eV, is attributed to an oxygen-deficient component such as zinc hydroxide.[30] The maximum valence band spectrum (FIG. 6B) confirms that the ZnO is an n-type metal oxide. The work function of the ZnO is determined to be 4.2 eV by UPS shown in FIG. 5F. For comparison, the UPS of PCBM is also included in FIG. 5F. It can be found that ZnO and PCBM show similar work functions; both of them are close to the conduction band of perovskite of $CH_3NH_3PbI_3$.[3]

Figure 8:
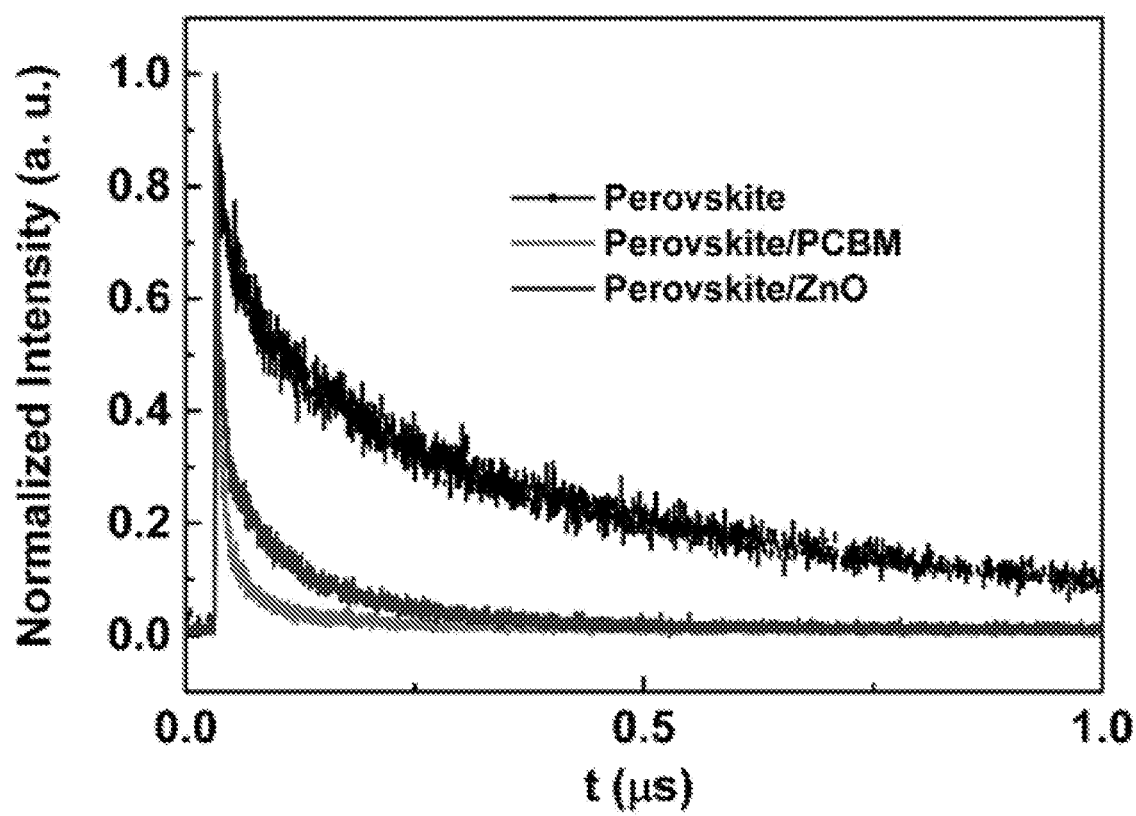
FIG. 8 shows time-resolved photoluminescence (TRPL) of glass/$CH_3NH_3PbI_3$, glass/$CH_3NH_3PbI_3$/ZnO, and glass/$CH_3NH_3PbI_3$/PCBM.
Figure 9:
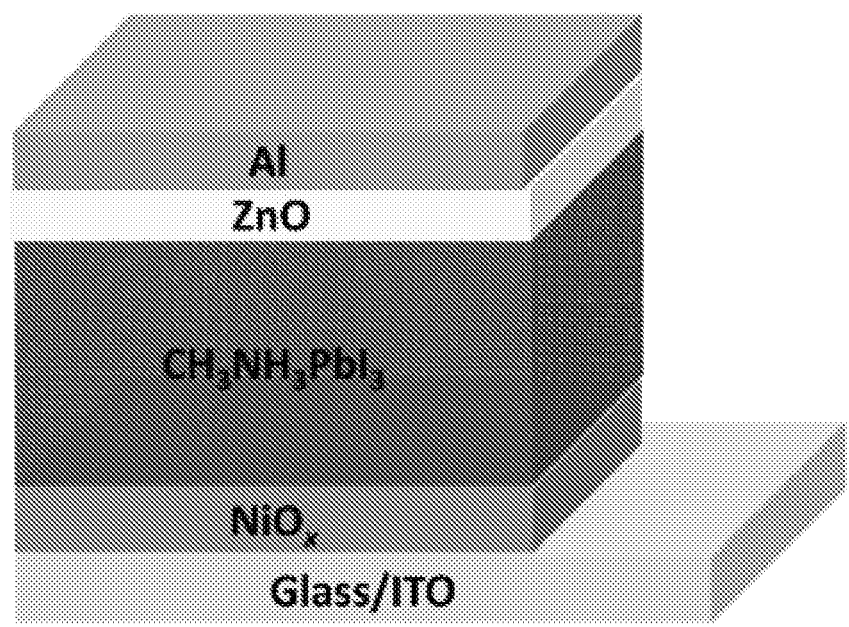
FIG. 9 shows the device structure of metal oxide, Glass/ITO/$NiO_x$/$CH_3NH_3PbI_3$/ZnO/Al.
Figure 10:
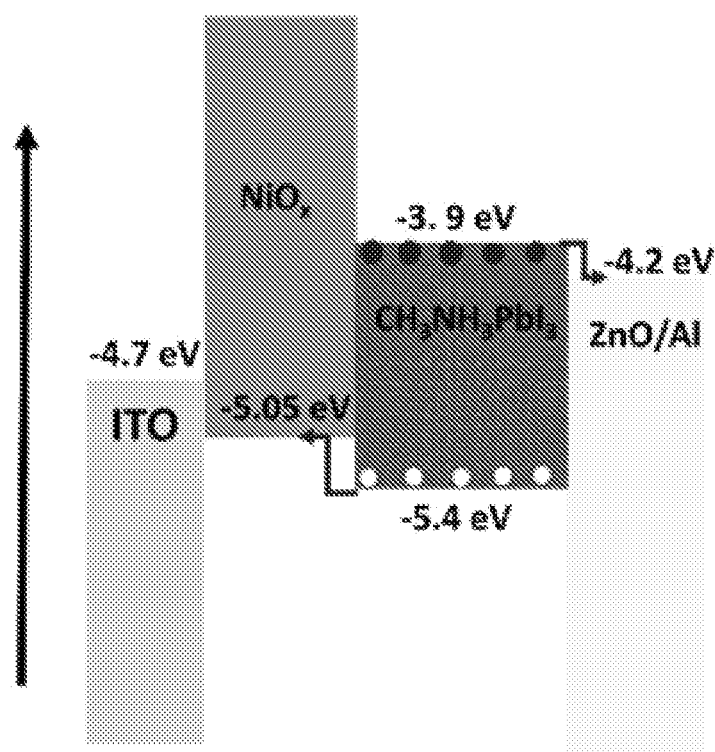
FIG. 10 shows the band alignment of the metal oxide based perovskite solar cells according to the UPS data shown in FIGS. 5C and 5F.

To study the charge transport and collection efficiency between the perovskite materials with the corresponding metal oxide layers, the photoluminescence (PL) of the perovskite with the metal oxide layers has been studied. It was shown that the crystallinity of perovskite on different surfaces is totally different.[31] Thus, it is hard to define the PL quench effect between the perovskite with the bottom of buffer layer (NiO$_x$). Here, we focus on the charge transport layer study between perovskite layers with the top layer (ZnO). The steady-state photoluminescence (PL) and time-resolved photoluminescence (TRPL) of the CH$_3$NH$_3$PbI$_3$ with and without the ZnO capping layer are shown in FIG. 7. The PL intensity has been quenched a lot, and as a result, the life time of perovskite has been decreased from 145 ns to 21 ns, indicating that the ZnO was also a good charge transport layer for the perovskite (FIG. 8). The PL quench for perovskite/PCBM has also been studied. It seems that the PCBM is a better quencher for the CH$_3$NH$_3$PbI$_3$ from the steady and time-resolve photoluminescence.[32, 33] However, the devices shown below indicate that the ZnO can still give similar or even better device performance than that of the PCBM buffer layer. It was shown that the NiO$_x$ is an efficient hole transport layer in organic solar cells[26, 27] and also in perovskite solar cells,[20-24, 34] and we believe that the NiO$_x$ films achieved in this study can act as an effective p-type charge transport layer. The device structure of a metal oxide based perovskite solar cell according to some embodiments is shown in FIG. 9, i.e. the glass/ITO/NiO$_x$/perovskite/ZnO/Al, where the NiO$_x$ and ZnO were used as the hole and electron transport layers, respectively. The band alignment of the devices are shown in FIG. 10 based on the work function of the NiO$_x$ and ZnO determined by the UPS shown in FIG. 5C, and also the band structure of perovskite (CH$_3$NH$_3$PbI$_3$).[3] Based on this device structure, when the device is exposed to light, an electron-hole will be generated in the perovskite layer, move to the interface between the perovskite and metal oxides, and then be collected by the electrodes.

Figure 11:
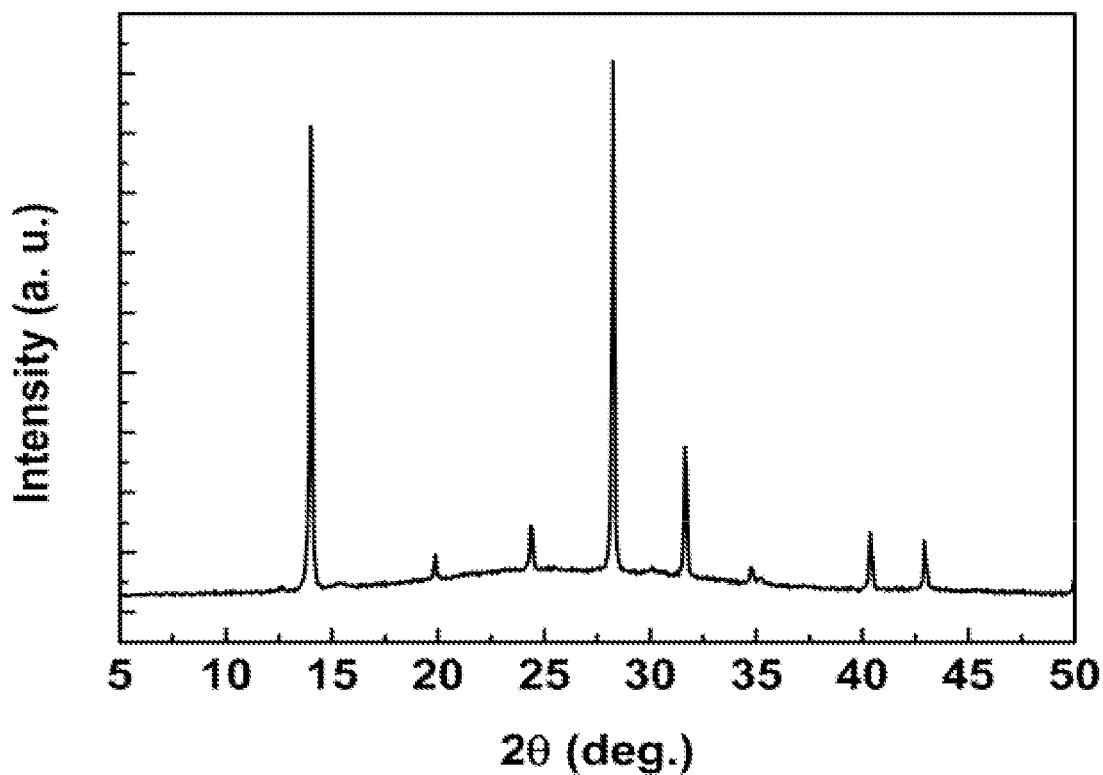
FIG. 11 illustrates an X-ray diffraction pattern of the $CH_3NH_3PbI_3$ obtained by two-step spin-coating process.
Figures 12A, 12B, 12C:
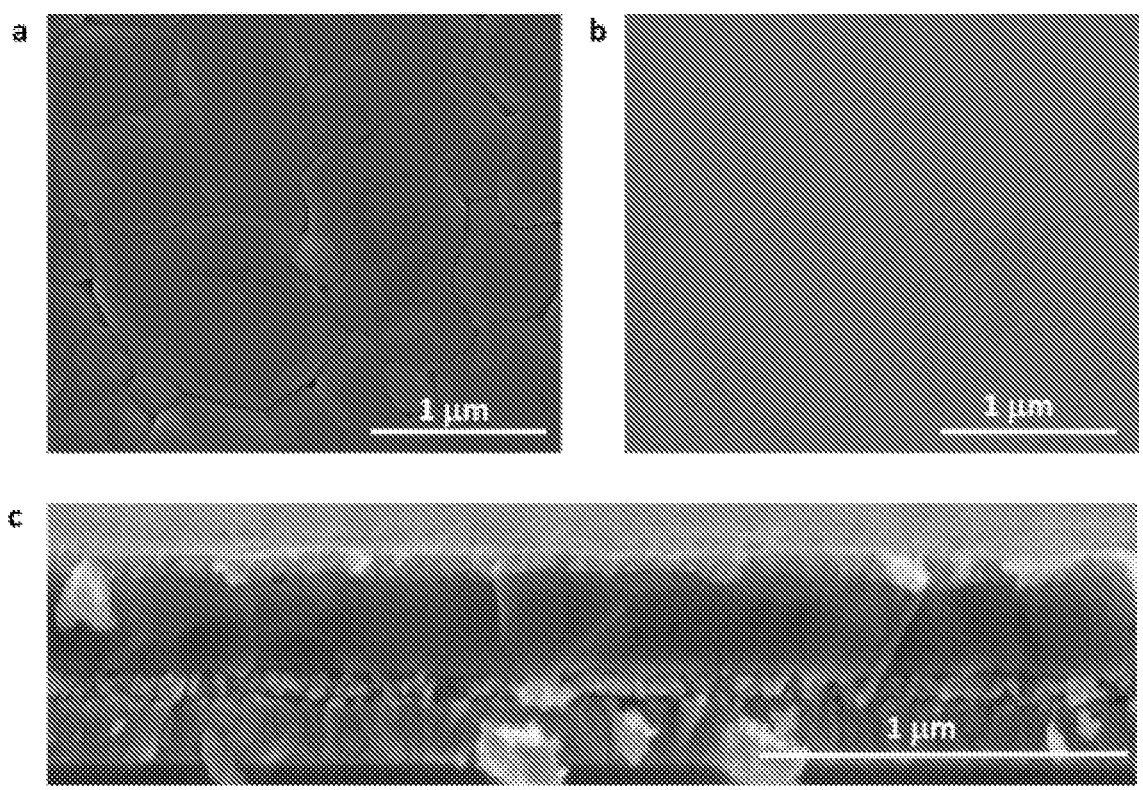
FIG. 12A shows an SEM image of the perovskite growth on an NiOx surface achieved by two step-processing.
FIG. 12B shows an SEM image of perovskite coated by ZnO films.
FIG. 12C shows the cross-section of the metal oxide based perovskite solar cells, wherein the thickness of $NiO_x$, $CH_3NH_3PbI_3$, and ZnO are 80 nm, 330 nm, and 70 nm, respectively.
Figure 13:
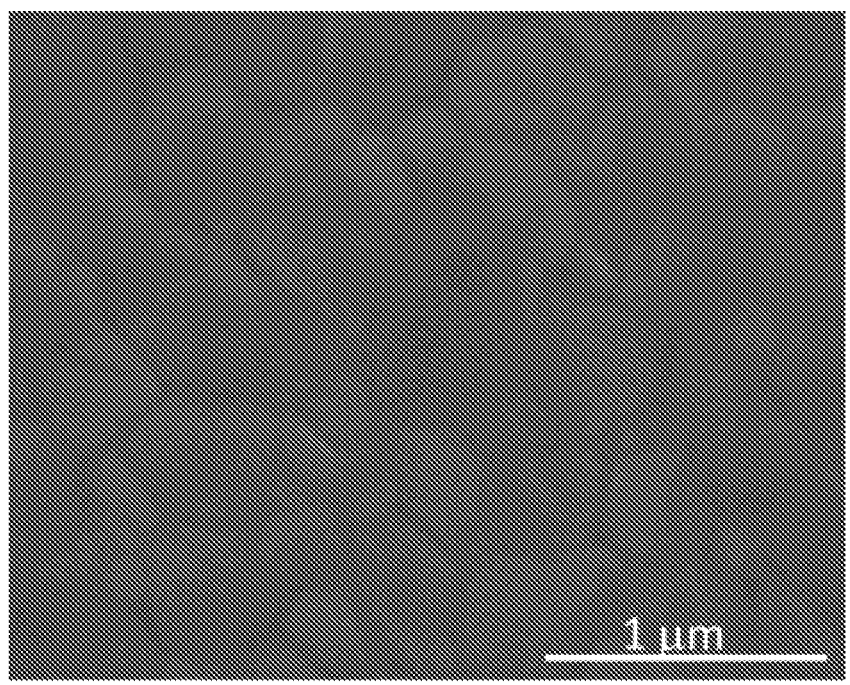
FIG. 13 shows an SEM image of perovskite film on a PEDOT:PSS substrate by a two-step spin-coating process.

The X-ray diffraction pattern of perovskite formed on a NiO$_x$ substrate is shown in FIG. 11. All of the diffraction peaks come from CH$_3$NH$_3$PbI$_3$ except for the small peak at 12.6°, indicating that the layer on NiO$_x$ surface is mainly CH$_3$NH$_3$PbI$_3$, with a small amount of residual PbI$_2$. The scanning electron microscopy image of the perovskite film growth on NiO$_x$ is shown in FIG. 12A. The film showed the large crystal size above 1 μm, and is almost free of pinholes. For comparison, a perovskite film grown on PEDOT:PSS is shown in FIG. 13. The crystal size is about 300-500 nm, indicating the NiO$_x$ surface can give better crystallinity of perovskite film. This improvement of crystallinity of perovskite on an NiO$_x$ surface could be due to induced crystal growth by the crystallized substrate or rougher surface. The top image of perovskite film capped by ZnO is shown in FIG. 12B. The perovskite film has been fully covered by the ZnO nanoparticles. As a result, the subsequently deposited electrode such as Al or Ag will not react with the perovskite, and will also keep the interface stabile. The cross section of the device (not including the top electrode) is shown in FIG. 12C. The sandwich structure of NiO$_x$/perovskite/ZnO can be easily distinguished, and the thicknesses of the layers are 80 nm, 320 nm and 70 nm, respectively. It can also be found that the NiO$_x$ layer is dense, and the formation of the perovskite layer is almost free of pin-holes and is smooth. It must be noted that the crystal size (>1 μm) of perovskite is larger than the thickness (~300 nm), indicating that the charge could transport and collect in one crystal, which is helpful for achieving high device performance.[35]

Figures 14A, 14B, 14C, 14D:
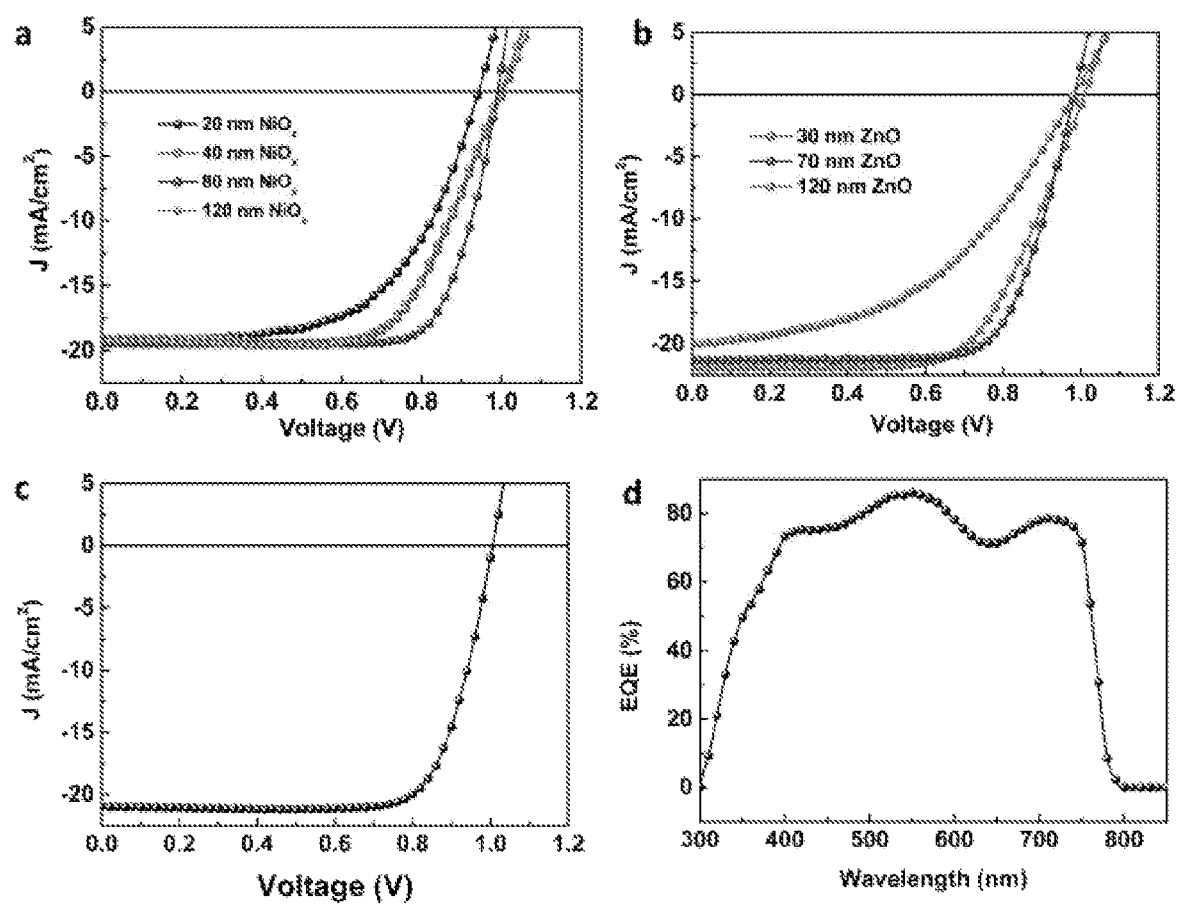
FIG. 14A shows how the device performance using $NiO_x$ as hole transport layers depends on thickness based on a device structure of glass/ITO/$NiO_x$/$CH_3NH_3PbI_3$/PCBM/Al.
FIG. 14B shows how the device performance using ZnO as electron transport layers depends on thickness based on a device structure of glass/ITO/$NiO_x$ (80 nm)/$CH_3NH_3PbI_3$/ZnO/Al.
FIG. 14C illustrates the champion device performance of metal oxide based perovskite solar cells.
FIG. 14D shows the external quantum efficiency (EQE) of the metal oxide based perovskite solar cells.

The device performance using NiO$_x$ and ZnO as charge transport layers was systematically studied. The dependence of device performance on NiO$_x$ thickness was investigated based on the device structure of glass/ITO/NiO$_x$/CH$_3$NH$_3$PbI$_3$/PCBM/Al. The results are shown in FIG. 14A and also summarized in Table I. It was found that the device can show optimized performance when the thickness of the NiO$_x$ is sufficient. When the NiO$_x$ layer is thin, it cannot fully cover the ITO surface, resulting in the perovskite layer being in direct contact with the ITO substrate, thus leading to leakage or bad band alignment. On the other hand, the series resistance will be increased if the NiO$_x$ layer is too thick. It was found that the optimal thickness of NiO$_x$ layer for the devices is around 80 nm because the NiO$_x$ layer will guarantee the coverage and also the electronic charge transport.

TABLE I

| $t_{NiOx}$ (nm) | Voc (V) | Jsc (mA/cm$^2$) | FF (%) | PCE (%) |
|---|---|---|---|---|
| 20 | 0.94 | 19.4 | 59.0 | 10.8 |
| 40 | 1.00 | 19.0 | 67.8 | 12.9 |
| 80 | 0.99 | 19.5 | 76.6 | 14.8 |
| 120 | 1.01 | 19.3 | 67.0 | 13.0 |

The optimized condition of the ZnO on the perovskite layer were also investigated based on the device configuration of glass/ITO/NiO$_x$ (80 nm)/CH$_3$NH$_3$PbI$_3$/ZnO (x nm)/Al. The device performance with different thicknesses of ZnO electron transport layers is shown in FIG. 14B and summarized in Table II. It was found that the optimized thickness of ZnO is around 70 nm. The best device performance based on the optimized conditions are shown in FIG. 14C. The VOC is 1.01 V, JSC is 21.0 mA/cm$^2$, and FF is 0.76, leading to an efficiency as high as 16.1%.

TABLE II

| $t_{ZnO}$ (nm) | Voc (V) | Jsc (mA/cm$^2$) | FF (%) | PCE (%) |
|---|---|---|---|---|
| 30 | 1.01 | 21.7 | 64.8 | 14.2 |
| 70 | 0.98 | 21.3 | 71.8 | 15.0 |
| 70 | 1.01 | 21.0 | 76.0 | 16.1* |
| 120 | 0.98 | 20.1 | 46.6 | 9.2 |

Figure 15:
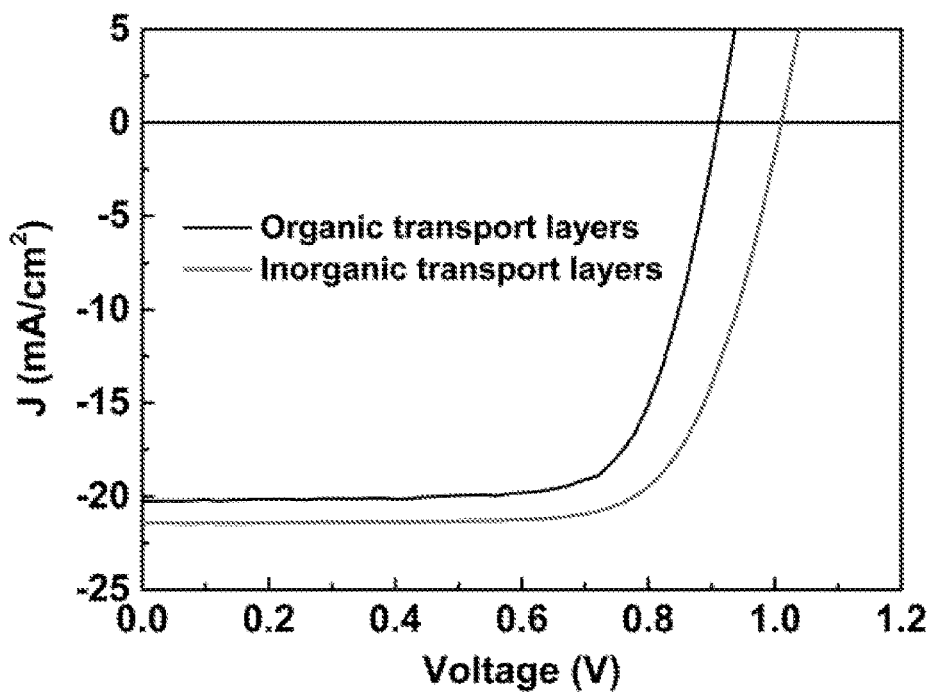
FIG. 15 shows J-V curve of the devices based on organic or inorganic charge transport layers.

The all metal oxide charge transport layers based perovskite devices showed promising performance, even better than that of the devices using all organic transport layers (FIG. 15). The NiO$_x$ layer can give higher VOC while the ZnO layer can give higher J$_{SC}$. The higher V$_{OC}$ from the NiO$_x$ based device could be from two factors: band alignment between the hole transport layer and the perovskite layer, and better crystallinity of the perovskite layer on the NiO$_x$ substrate (FIGS. 12A-12C and FIG. 13). This will decrease the recombination and increase V$_{OC}$. The higher J$_{SC}$ from the ZnO based device could be attributed to the strong hole blocking effect due to the deep valence band of ZnO.[36] The external quantum efficiency of the all metal oxide based devices is shown in FIG. 14D. The integrated short circuit current is consistent with the value measured from the solar simulator.

Figures 16A, 16B, 16C, 16D:
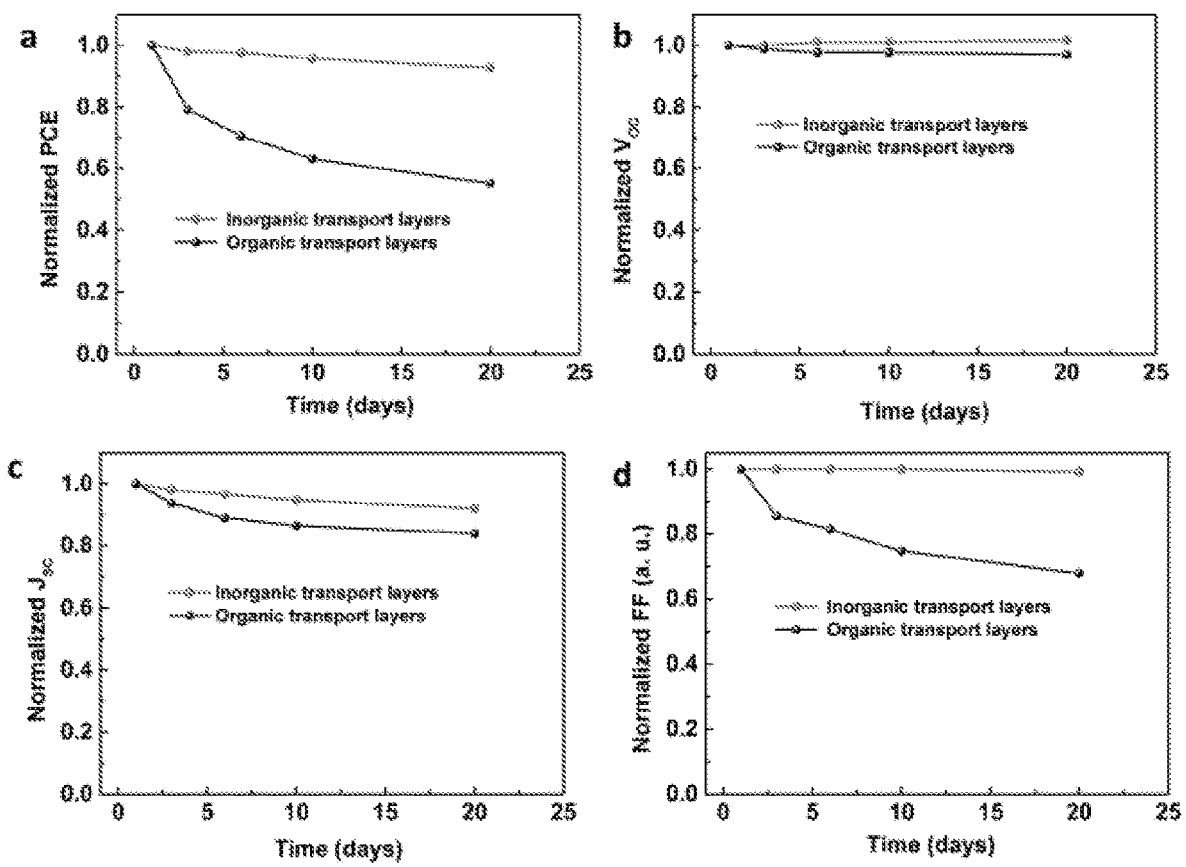
FIG. 16A shows the normalized power conversion efficiency of devices with inorganic transport layers ($NiO_x$ as hole transport layer, ZnO as electron transport layer) and organic transport layers (PEDOT:PSS as hole transport layer and PCBM as electron transport layer) as a function of storage time in a nitrogen box.
FIG. 16B shows the normalized open circuit voltage of devices with inorganic transport layers ($NiO_x$ as hole transport layer, ZnO as electron transport layer) and organic transport layers (PEDOT:PSS as hole transport layer and PCBM as electron transport layer) as a function of storage time in a nitrogen box.
FIG. 16C shows the normalized short circuit current of devices with inorganic transport layers ($NiO_x$ as hole transport layer, ZnO as electron transport layer) and organic transport layers (PEDOT:PSS as hole transport layer and PCBM as electron transport layer) as a function of storage time in a nitrogen box.
FIG. 16D shows the normalized fill factor of devices with inorganic transport layers ($NiO_x$ as hole transport layer, ZnO as electron transport layer) and organic transport layers (PEDOT:PSS as hole transport layer and PCBM as electron transport layer) as a function of storage time in a nitrogen box.

Lastly, the stability of the devices using inorganic or organic charge transport layers were monitored, and the results are shown in FIG. 16A-16D. The metal oxide based devices (labelled as inorganic charge transport layers) retain their original power conversion efficiency after 20 days stored in the nitrogen glove box (FIG. 16A, J-V curve of the devices are shown in FIGS. 17A and 17B). As shown in FIG. 16A, the normalized power conversion efficiency remains substantially constant over a period of 20 days, decreasing by less than 10% of the initial value. However, for the devices based on organic charge transport layers, such as PEDOT:PSS (HTL) and PCBM (ETL), the power conversion efficiency dropped significantly. The efficiency was degraded about 40% after 20 days in storage. The degradation of the detailed parameters such as $J_{SC}$, $V_{OC}$ and FF vs. time for the devices using two series of charge transport layers (inorganic or organic) are shown in FIGS. 16B-16D. It can be found that the degradation of organic buffer layer based devices mainly from the FF, which is highly possible from the interface deterioration. While introducing the metal oxide charge transport layers, the device showed significant improvement on stability, the FF remained nearly the same after 20 days storage, indicating the improvement mainly from oxide layer has been greatly improved.

Materials and Methods According to Some Embodiments

According to some embodiments of the invention, Nickel (II) nitrate hexahydrate ($Ni(NO_3)_2 \cdot 6H_2O$) (sigma aldrich) was dissolved in ethylene glycol solution containing 1 M Nickel(II) nitrate hexahydrate with ethylenediamine (Aldrich). The solution was spun-cast on glass/ITO substrate at a spin-speed ranging from 1000-4000 rpm for 90 seconds for controlling the $NiO_x$ thickness. Then, the substrate was post-annealed at 300° C. in ambient air for 60 minutes.

According to some embodiments of the invention, the chemical synthesis of ZnO nanoparticles was performed using the method outlined by our previous results[37]. The difference is that methanol has been totally removed to prevent the residual methanol solvent from decomposing the perovskite layer. It has been confirmed that some solvents such as ethanol and methanol can degrade the perovskite layer. After drying the ZnO nanoparticles, the powder is then re-dispersed in chlorobenzene with a concentration of 2%. The thicknesses of the ZnO layer was controlled by the spin-speed.

Device fabrication and measurement according to some embodiments of the invention is now described. PEDOT:PSS was spin-cast on an ITO surface at 4000 rpm, and then annealed at 120° C. for 15 min in ambient air. The $NiO_x$ precursor was spin-coated on ITO and annealed at 300° C. for 60 min in ambient air. Then the substrates were transferred into a nitrogen glove box for coating of the perovskite layer. It was found that a one-step solution process may not form a sufficiently high quality perovskite film on $NiO_x$,[21, 24, 34] which could be due to the surface roughness of $NiO_x$ induced over the crystallinity of the perovskite. According to some embodiments, a two-step process can be adopted to obtain a high quality perovskite layer.[14] The $PbI_2$ layer was spin-coated firstly using the 460 mg/ml solution, and then dried at 70° C. for 10 min. Then, 50 mg/ml of $CH_3NH_3I$ solution was coated on the $PbI_2$ layer. After that, the film was taken out for annealing in ambient air (it was confirmed that a certain level of moisture can induce higher perovskite crystallinity[13]) at 100° C. for 2 hours.[14] For PCBM coating, a 2% PCBM in chlorobenzene solution was coated onto the perovskite layer at 1000 rpm. For ZnO, different thicknesses of ZnO were coated on the perovskite surface by controlling the spin-coating speed. Finally, the device was transferred to a vacuum chamber for Al electrode evaporation. The device's area is 0.1 cm$^2$, though the embodiments of the invention are not limited to this size, and can be larger or smaller. J-V characteristics of photovoltaic cells were taken using a Keithley 2400 source measure unit under a simulated AM1.5G spectrum. With an Oriel 9600 solar simulator, the light intensity was calibrated by a KG-5 Si diode. The J-V measurements were carried out in a nitrogen glove box. The measurement details can be found in FIG. 18, and a summary of the device performance is given in Table III. The devices were taken out for external quantum efficiency (EQE) measurement, and were measured by an Enli tech (Taiwan) EQE measurement system.

TABLE III

|  | Voc (V) | Jsc (mA/cm$^2$) | FF (%) | PCE (%) |
| --- | --- | --- | --- | --- |
| Reverse Scan | 0.99 | 20.7 | 75.6 | 15.5 |
| Forward Scan | 0.97 | 20.2 | 73.4 | 14.4 |

The embodiments of the invention are not limited to the materials described above. For example, the p-type buffer layer can include a metal oxide, for example, one or more of $NiO_x$, $MoO_3$, $V_2O_5$, and $WO_3$. The n-type buffer layer can also include a metal oxide, for example, one or more of $TiO_2$, ZnO, and $Nb_2O_5$. The perovskite semiconductor active layer can consist essentially of at least one perovskite that satisfies the formula $ABX_3$, wherein A is at least one of $CH_3NH_3$ and $NH_2CHNH_2$, wherein B is at least one of PB and Sn, and wherein X is at least one of Cl, Br and I.

In conclusion, we have successfully demonstrated perovskite solar cells employing all solution processed metal oxide layers as the charge transport layers. The device has greater than 16% power conversion efficiency. The devices based on the metal oxide charge transport layers also showed significant improvement in stability.

REFERENCES

[1] Kagan, C. R., Mitzi, D. B. & Dimitrakopoulos C. D. Organic-inorganic hybrid materials as semiconducting channels in thin-film field-effect transistors. *Science* 286, 945-947 (1999).

[2] Kojima, A., Teshima, K., Shirai, Y. & Miyasaka, T. Organometal halide perovskites as visible-light sensitizers for photovoltaic cells. *J. Am. Chem. Soc.* 131, 6050 (2009).

[3] Kim, H. S. et al. Lead iodide perovskite sensitized all-solid-state submicron thin film mesoscopic solar cell with efficiency exceeding 9%. *Sci. Rep.* 2, 591 (2012).

[4] Lee, M. M. et al. Efficient hybrid solar cells based on meso-superstructured organometal halide perovskites. *Science* 338, 643(2012).

[5] Burschka, J. et al. Sequential deposition as a route to high-performance perovskite-sensitized solar cells. *Nature* 499, 316 (2013).

[6] Liu, M., Johnston, M. B. & Snaith, H. J. *Nature* 2013, 501, 395-398.

[7] Best Research Cell Efficiencies. http://www.nrel.gov/ncpv/images/efficiency_chart.jpg.

[8] Jeon, N. J. et al. Solvent engineering for high-performance inorganic-organic hybrid perovskite solar cells. *Nat. Mater.* 13, 897 (2014).

[9] Im, J. H., Jang, I. H., Pellet, N., Grätzel, M. & Park, N. G. Growth of $CH_3NH_3PbI_3$ cuboids with controlled size for high-efficiency perovskite solar cells. *Nat. Nanotech.* 9, 927 (2014).

[10] Zhou. H., Chen, Q., Li, G., Luo, S., Song, T. B., Duan, H. S., Hong, Z., You, J., Liu, Y. & Yang, Y. Interface engineering of highly efficient perovskite solar cells. *Science,* 345, 542 (2014).

[11] Wojciechowski, K. et al. Heterojunction modification for highly efficient organic-inorganic perovskite solar cells. *ACS Nano*, DOI: 10.1021/nn505723h. (2014).

[12] Xiao, M. et al. Angew. Chem., Int. Ed. 53, 9898 (2014).
[13] You, J., Yang, Y., Hong, Z, Song, T, Meng, L., Liu, Y, Jiang, C, Zhou, H., Chang, W., Li, G. & Yang, Y. Moisture assisted perovskite film growth for high performance solar cells. *Appl. Phys. Lett.* 105, 183902 (2014).
[14] Xiao, Z. G. et al. Efficient, high yield perovskite photovoltaic devices grown by interdiffusion of solution-processed precursor stacking layers. *Energy Environ. Sci.* 7, 2619 (2014).
[15] Conings, B. et al. Perovskite-based hybrid solar cells exceeding 10% efficiency with high reproducibility using a thin film sandwich approach. *Adv. Mater.* 26, 2041 (2014).
[16] Jeng, J. Y. et al. $CH_3NH_3PbI_3$ perovskite/fullerene planar-heterojunction hybrid solar cells *Adv. Mater.* 25, 3727 (2013).
[17] Liang, P. W. et al. Additive enhanced crystallization of solution-processed perovskite for highly efficient planar-heterojunction solar cells. *Adv. Mater.* 26, 3748 (2014).
[18] Qin, P. et al. Inorganic hole conductor-based lead halide perovskite solar cells with 12.4% conversion efficiency. *Nat. Commun.* 5, 3834 (2014).
[19] Subbiah, A. S. et al. Inorganic hole conducting layers for perovskite-based solar cells. *J. Phys. Chem. Lett.,* 5, 1748 (2014).
[20] Christians, J. A. et al. An inorganic hole conductor for organo-lead halide perovskite solar cells. improved hole conductivity with copper iodide. *J. Am. Chem. Soc.* 136, 758 (2014).
[21] Jeng, J. Y. et al. Nickel oxide electrode interlayer in $ch_3nh_3pbi_3$ perovskite/pcbm planar-heterojunction hybrid solar cells. *Adv. Mater.* 26, 4107(2014).
[22] Wang, K. C. et al. Low-temperature sputtered nickel oxide compact thin film as effective electron blocking layer for mesoscopic $NiOx/CH_3NH_3PbI_3$ perovskite heterojunction solar cells. *ACS Appl. Mater. Interfaces,* 6, 11851 (2014).
[23] Wang, K. C. et al. P-type mesoscopic nickel oxide/organometallic perovskite heterojunction solar cells. *Sci. Rep.* 4, 4756 (2014).
[24] Zhu, Z. L. et al. High-performance hole-extraction layer of sol-gel-processed $NiO_x$ nanocrystals for inverted planar perovskite solar cells. *Angew. Chem. Int. Ed.* 53, 12571 (2014).
[25] Liu, D. Y. & Kelly, T. L. Perovskite solar cells with a planar heterojunction structure prepared using room-temperature solution processing techniques. *Nat. Photon.* 8, 133 (2014).
[26] Garcia, A. et al. Improvement of interfacial contacts for new small-molecule bulk-heterojunction organic photovoltaics. *Adv. Mater.* 24, 5368 (2012).
[27] Manders, J. R. et al. Solution-processed nickel oxide hole transport layers in high efficiency polymer photovoltaic cells. *Adv. Funct. Mater.* 23, 2993 (2013).
[28] Rim, Y. S., Chen, H. J., Liu, Y. S., Bae, S. H., Kim, H. J. & Yang, Y. Direct light pattern integration of low-temperature solution-processed all-oxide flexible electronics. *ACS Nano* 8, 9680 (2014).
[29] Chen, Q. et al. Controllable self-induced passivation of hybrid lead iodide perovskites toward high performance solar cells. *Nano Lett.* 14, 4158 (2014).
[30] Sun, Y. M. et al. Inverted polymer solar cells integrated with a low-temperature-annealed sol-gel-derived ZnO film as an electron transport layer. *Adv. Mater.* 23, 1679 (2011).
[31] You, J., Hong, Z., Yang, Y., Chen, Q., Cai, M., Song, T. Z., Chen, C. C., Lu, S. R., Liu, Y. S., Zhou, H. P. & Yang, Y. Low-temperature solution-processed perovskite solar cells with high efficiency and flexibility. *ACS Nano,* 8, 1674 (2014).
[32] Stranks, S. D. et al. Electron-hole diffusion lengths exceeding 1 micrometer in an organometal trihalide perovskite absorber. *Science* 342, 341 (2013).
[33] Xing, G. C. et al. Long-range balanced electron- and hole-transport lengths in organic-inorganic $CH_3NH_3PbI_3$. *Science,* 342, 344 (2013).
[34] Docampo, P. et al. Efficient organometal trihalide perovskite planar-heterojunction solar cells on flexible polymer substrates. *Nat. Commun.* 4, 2761 (2013).
[35] Xiao, Z. G. et al. Solvent annealing of perovskite-induced crystal growth for photovoltaic-device efficiency enhancement. *Adv. Mater.* 26, 6503 (2014).
[36] You, J. et al. Electroluminescence behavior of ZnO/Si heterojunctions: energy band alignment and interfacial microstructure. *J. Appl. Phys.* 107, 083701 (2010).
[37] You, J., Chen, C. C., Dou, L., Murase, S., Duan, H., Hawks, S., Xu, T., Son, H. J., Yu, L. P., Li, G. & Yang, Y. Metal oxide nanoparticles as electron transport layer in high performance and stable inverted polymer solar cells. *Adv. Mater.* 24, 5267 (2012).

The embodiments illustrated and discussed in this specification are intended only to teach those skilled in the art how to make and use the invention. In describing embodiments of the invention, specific terminology is employed for the sake of clarity. However, the invention is not intended to be limited to the specific terminology so selected. The above-described embodiments of the invention may be modified or varied, without departing from the invention, as appreciated by those skilled in the art in light of the above teachings. It is therefore to be understood that, within the scope of the claims and their equivalents, the invention may be practiced otherwise than as specifically described.

We claim:

1. An opto-electronic device, comprising:
a first electrode;
a first buffer layer formed on said first electrode;
a perovskite semiconductor active layer formed on said first buffer layer;
a second buffer layer formed on said perovskite semiconductor active layer; and
a second electrode formed on said second buffer layer,
wherein said first buffer layer has a thickness between about 75 nm and about 85 nm,
wherein said second buffer layer has a thickness between about 65 nm and about 75 nm, and
wherein said first buffer layer is nickel oxide and said second buffer layer is zinc oxide.

2. An opto-electronic device according to claim 1, wherein said first and second electrodes each consists essentially of inorganic materials.

3. An opto-electronic device according to claim 1, wherein said first buffer layer comprises a plurality of nanoparticles.

4. An opto-electronic device according to claim 1, wherein said second buffer layer comprises a plurality of nanoparticles, wherein each of the plurality of nanoparticles has a size that is less than 10 nm.

5. An opto-electronic device according to claim 1, wherein said first buffer layer has a work function between about 5.00 eV and 5.10 eV.

6. An opto-electronic device according to claim 1, wherein said perovskite semiconductor active layer consists essentially of at least one perovskite that satisfies the formula $ABX_3$, wherein A is at least one of $CH_3NH_3$ and $NH_2CHNH_2$, wherein B is at least one of PB and Sn, and wherein X is at least one of Cl, Br and I.

7. An opto-electronic device according to claim 1, wherein said perovskite semiconductor active layer has a thickness between about 315 nm and about 325 nm.

8. An opto-electronic device according to claim 1, wherein said perovskite semiconductor active layer comprises a plurality of crystals, and wherein each of said plurality of crystals has a width greater than 1 μm.

9. An opto-electronic device according to claim 1, wherein said perovskite semiconductor active layer comprises a plurality of crystals, and wherein each of said plurality of crystals has a width that is greater than a thickness of said perovskite semiconductor active layer.

10. An opto-electronic device according to claim 1, wherein at least one of said first and second electrodes is a transparent electrode.

11. An opto-electronic device according to claim 1, wherein said opto-electronic device is at least one of a photovoltaic cell, an optical detector, a radiation detector, a light emitting diode (LED), a laser and a memory device.

12. An opto-electronic device according to claim 1, wherein said opto-electronic device has a normalized power conversion efficiency that remains substantially constant over a period of 20 days.

13. A method of producing an opto-electronic device, comprising:

providing a substrate;

forming a first electrode on said substrate;

forming a first buffer layer on said first electrode;

forming a perovskite semiconductor active layer on said first buffer layer;

forming a second buffer layer on said perovskite semiconductor active layer; and forming a second electrode on said second buffer layer, wherein said first buffer layer has a thickness between about 75 nm and about 85 nm, wherein said second buffer layer has a thickness between about 65 nm and about 75 nm, and wherein said first buffer layer is nickel oxide and said second buffer layer is zinc oxide.

14. A method of producing an opto-electronic device according to claim 13, further comprising treating said perovskite semiconductor active layer with at least one of an exposure to air for less than one hour, exposure to oxygen, exposure to ultraviolet light, moisture exposure and thermal annealing with a temperature less than 120° C.

15. A method of producing an opto-electronic device according to claim 13, wherein forming a perovskite semiconductor active layer on said first buffer layer comprises:

forming a layer of $PbI_2$ on said first buffer layer;

coating said $PbI_2$ layer with a $CH_3NH_3I$ solution; and annealing said $CH_3NH_3I$ solution coated $PbI_2$ layer to form said perovskite semiconductor active layer.

* * * * *